United States Patent [19]

Schevin et al.

[11] Patent Number: 4,740,995
[45] Date of Patent: Apr. 26, 1988

[54] VARIABLE FREQUENCY SINUSOIDAL SIGNAL GENERATOR, IN PARTICULAR FOR A MODEM

[75] Inventors: Jean-Louis Schevin, Le Rouret; Pierre M. Carbou, Tourrette s/Loup, both of France

[73] Assignee: Texas Instruments Incorporated, Dallas, Tex.

[21] Appl. No.: 56,342

[22] Filed: May 27, 1987

Related U.S. Application Data

[63] Continuation of Ser. No. 642,271, Aug. 20, 1984, abandoned.

[30] Foreign Application Priority Data

Aug. 24, 1984 [FR] France ................ 83 13669

[51] Int. Cl.⁴ ........................................ H03B 19/14
[52] U.S. Cl. ........................ 375/62; 328/14; 333/173; 364/721; 375/65
[58] Field of Search ................... 375/9, 62, 65; 370/110.2; 328/14, 186; 364/718, 721; 333/173; 332/9 R, 11 R; 379/361, 418

[56] References Cited

U.S. PATENT DOCUMENTS

| 3,668,562 | 6/1972 | Fritkin | 332/9 R |
|---|---|---|---|
| 3,740,669 | 6/1973 | Nahay | 332/11 R |
| 3,792,360 | 2/1974 | Carlow | 328/14 |
| 4,171,466 | 10/1979 | Carbrey | 364/721 |
| 4,328,554 | 5/1982 | Mantione | 364/721 |
| 4,368,432 | 1/1983 | Levy | 328/14 |
| 4,486,846 | 12/1984 | McCallister | 364/721 |

FOREIGN PATENT DOCUMENTS 0016281 10/1980 European Pat. Off. .
0075161 3/1983 European Pat. Off. .

OTHER PUBLICATIONS

Elektronik, vol. 30, No. 16, Aug. 1981, pp. 64–66, Munich, De; M. Arnoldt

Primary Examiner—Benedict V. Safourek
Attorney, Agent, or Firm—N. Rhys Merrett; Melvin Sharp

[57] ABSTRACT

A sinusoidal signal generator having a frequency variable as a function of a selection signal applied to the generator. A clock generator (1, 2) is programmable as a function of the selection signal and adapted to provide a plurality of clock signals having variable frequencies. A D/A converter (7) generates from a difference fixed potential ($V_{ss}$, $V_r$), as a function of the clock signals utilized as sampling signals, a step signal having a sinusoidal envelope, of which the fundamental frequency is a function of the selection signal. A low pass filter (10) having transfer function which is dependent on the change in the fundamental frequency of the sinusoidal envelope (as controlled by the clock signals) rejects the harmonics contained in the step signal produced by the convertor (17), and provides a sinusoidal signal having a low harmnonic distortion.

24 Claims, 9 Drawing Sheets

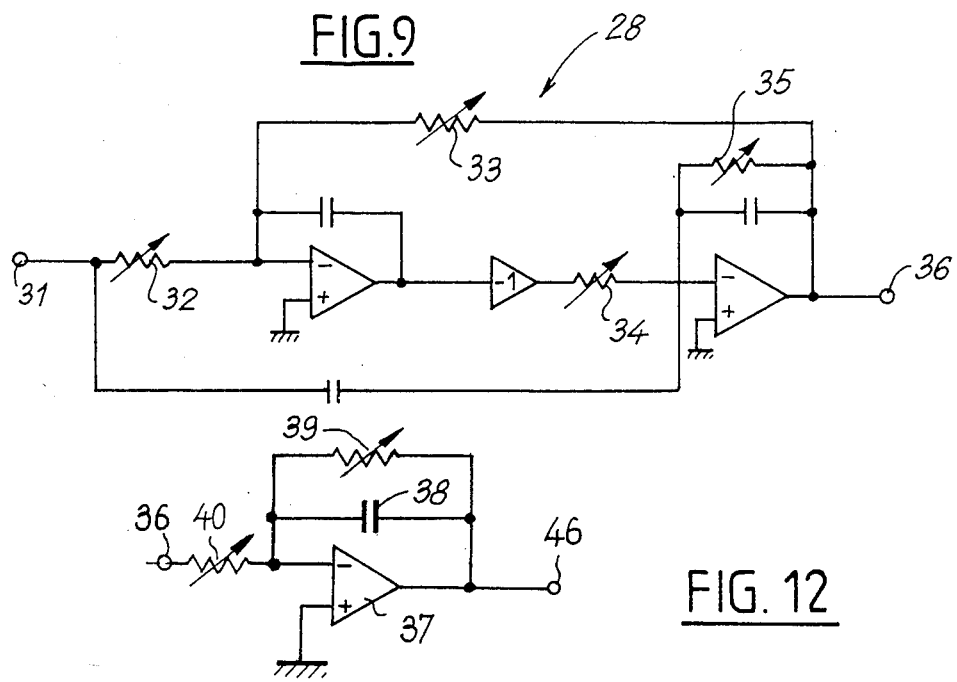
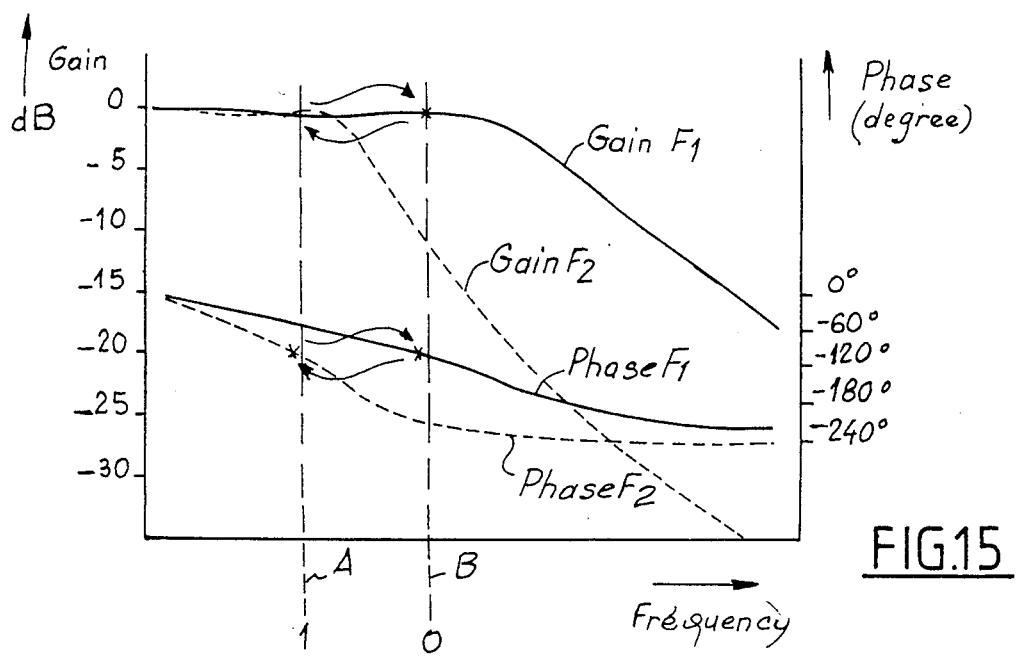

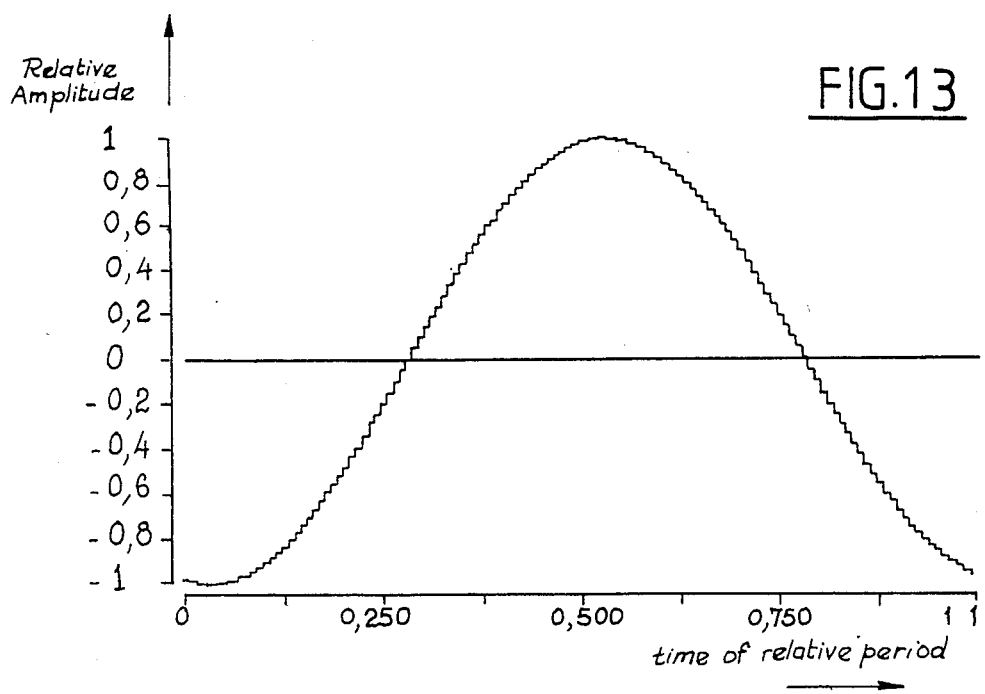
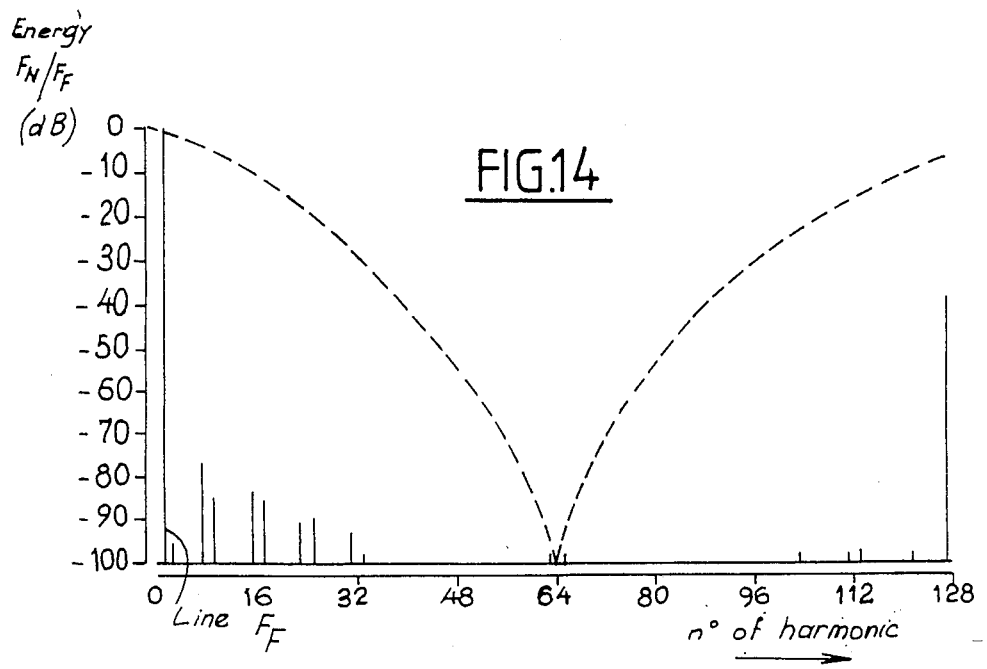

VARIABLE FREQUENCY SINUSOIDAL SIGNAL GENERATOR, IN PARTICULAR FOR A MODEM

This application is a continuation of application Ser. No. 642,271, filed Aug. 20, 1984, now abandoned.

This invention relates to the modulation of a sinusoidal type signal by a binary signal. More specifically, it relates to a sinusoidal signal generator whose frequency is dependent upon a binary signal to be transmitted. The invention finds particularly advantageous application in modulators/demodulators or modems adapted for transmitting binary signals on a telephone line.

To generate a sinusoidal signal representative of a flow of binary data, it is known to use a memory connected to a digital/analog convertor at the output of which there is produced a step sinusoidal signal.

The memory contains a certain number of binary values which are addressed by the data to be transmitted and when they are selected produce in the convertor a sample level which represents the sinusoidal signal. Such an arrangement has the drawback of being complex and the output signal is impaired by a quantification noise such that the sinusoidal signal obtained does not accurately reflect the input binary data.

These drawbacks render such an arrangement ill adapted to be used in a telephone modem. In fact, such a system must accurately convert the binary signals prior to transit over the line in order to avoid the loss of substantial information, this problem being even more crucial as the quantity of information which must transit over the telephone line between two data processing systems must be as high as possible and is tending to increase each day.

It is known that there exists different transmission standards for binary data over telephone lines. These standards provide for transmitting over a line a sinusoidal signal the frequency of which can vary as a function of the level of the binary signal to be transmitted. In other words, the sinusoidal signal takes selectively two frequency values according to whether the binary signal is at a high or low level. The frequency values are not the same for the different tranmission speeds selected in the standards mentioned above. Table I below indicates the different values most utilized currently.

TABLE 1

| Standard | High level Hz | Low level Hz | Transmission speeds bauds |
|---|---|---|---|
| EUROPE | | | |
| CCITT | 2100 | 1300 | 1200 |
| V23 | 1700 | 1300 | 600 |
| | 450 | 390 | 75 |
| U.S.A. | | | |
| Bell | 2200 | 1200 | 1200 |
| 202 | 487 | 387 | 150 |

To obtain a reliable transmission, it is therefore essential that the signal transit with a distortion which is as low as possible, in regard to harmonics, amplitude, group delay distortion and has a good phase coherence. In the particular case set forth above, this latter requirement is to the effect that the sinusoidal signal, when there is a frequency change due to a change in the binary level, should not have any phase discontinuity. This latter difficulty has not been satisfactorily resolved in the prior art in which there are often utilized two sinusoidal signal generators having different frequencies from which the output signal is taken by commutation as a function of the binary signal. The phase coherence is then obtained more or less poorly by means of complex circuitry.

All of the limitations set forth above are imposed not only on the line itself but also of course on the modem connected thereto. Until now, these modems were therefore extremely complex and large and it was not possible until now to obtain a miniaturization of a sufficient degree in these modems.

The invention contemplates therefore firstly the provision of a sinusoidal wave generator the frequency of which is dependent upon a binary signal, and which will be generated with minimal distortion and with a good phase coherence.

The invention also contemplates providing a telephone modem including a generator of the type indicated, permitting the possibility of realizing an entire integrated circuit on a single semiconductor chip.

The invention provides a generator of the type indicated above including a clock generator programmable as a function of the binary signal and adapted to produce at least two clock signals of different frequencies, a digital/analog convertor which, as a function of the clock signals used as sampling signals, generates, from a fixed voltage difference, a step signal having a sinusoidal envelope whose fundamental frequency is a function of one or the other of said clock signals, and a low pass filter whose transfer function is dependent upon the selection of the clock signals for rejecting the harmonics contained in the step signal produced by said convertor, the filter providing at the output the sinusoidal signal representing said binary signal.

These characteristics relate to a circuit which can be realized by impedence commutation techniques, and which lend themselves well to large scale integration, for example, using CMOS technology. In addition, the sinusoid produced is harmonic filtered so that one can avoid the difficulties created by harmonic distortions and group delay.

The invention also provides a telephone modem having a generator such as set forth above.

The invention will be better understood with the aid of the following description of a specific embodiment of the invention, by way of example, as illustrated by the drawings.

FIG. 9 is a diagram equivalent to the first section of the filter.

FIG. 12 is an equivalent diagram of the second section of the filter.

FIGS. 13 and 14 are the wave form and the spectrum, respectively, of the output signal and the spectrum of the second section of the filter.

FIG. 15 is a gain/frequency and phase/frequency illustrating the performance of an embodiment of the invention.

Figure 1:
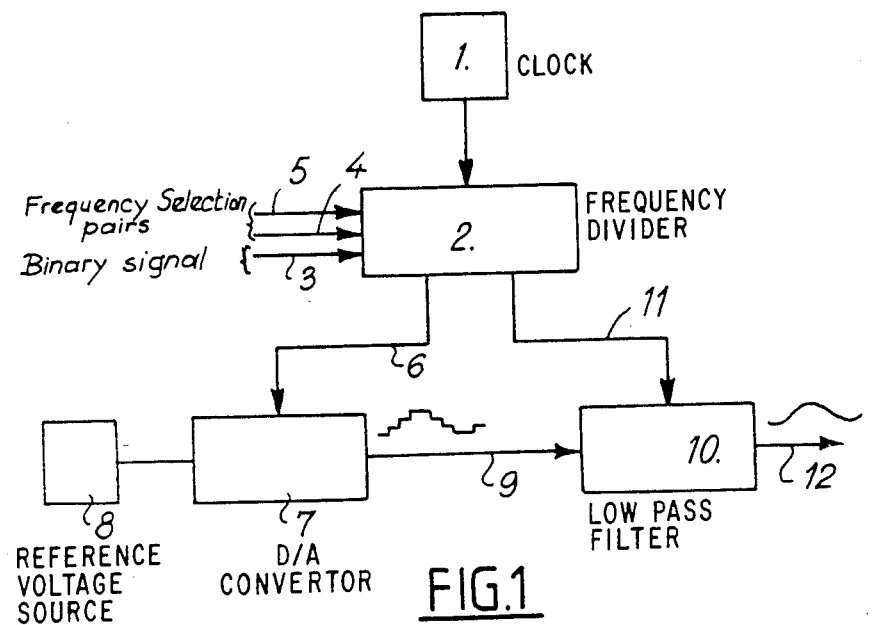
FIG. 1 is a very simplified diagram of a controlled sinusoidal wave generator, embodying the invention.

FIG. 1 shows a very simplified diagram of a sinusoidal wave generator embodying the invention. This generator includes a stable base clock 1 providing a very high frequency signal of about 4 MHZ for example. The frequency output of this clock is divided into several control signals in frequency divider 2 the division ratio of which is programmable as a function of one or more signals which are applied on leads 3, 4, and 5. The lead 3 can receive for example a binary signal, the levels of which can alternatively select two frequencies at the output of the divider while the leads 4 and 5 are adapted to selectively determine the different frequency pairs from which each of the frequencies is selected in the manner indicated by lead 3. There will be described hereinafter the manner in which the frequency divider 2 is constructed.

This latter provides on its outputs control signals, the frequency of which reflect the state of the inputs 3, 4, and 5. The leads 4 and 5 can be placed at a high or low level so that four combinations of two frequencies can be selected. In other words, the generator thus conceived is particularly well adapted to be incorporated into a multistandard modem, the lead 3 receiving the binary signals to be transmitted and the leads 4 and 5 receiving a binary signal, the value representing one of the selected standards indicated above in Table 1.

A group of variable frequency control signals is applied by line 6 to a digital-to-analog (D/A) convertor 7 connected to reference source 8, while the wave form obtained by sampling at the output of the convertor is applied by line 9 to a low-pass filter 10, the transfer function of which can be modified as a function of the control signal from divider 2 over line 11, this transfer function depending on the signals applied over leads 3 to 5. Output 12 of filter 10 transmits a sinusoidal signal, the frequency of which is controlled by the logical state of the leads 3 to 5.

The construction of the generator to be described is based on the fact that one can generate a sinusoidal envelope voltage from the absolute value of two levels of reference voltage by sampling these levels selectively at a rate which is eight times the frequency of the sinusoid to be obtained.

Figure 2:
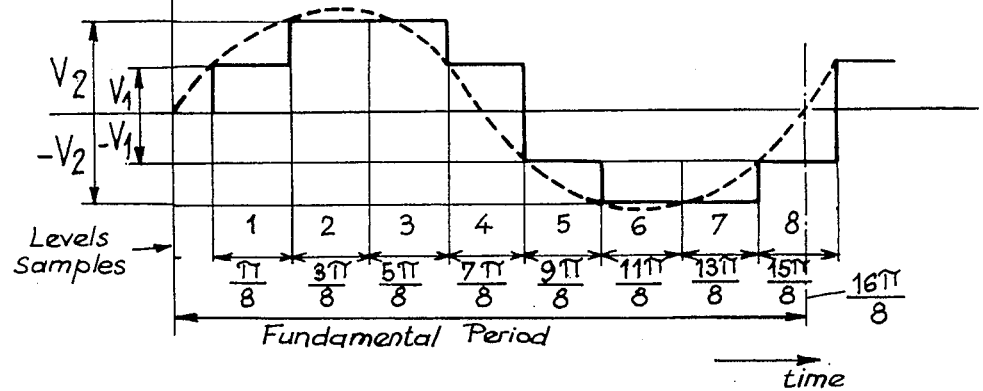
FIG. 2 is a diagram of the sinusoidal wave form obtained in the D/A convertor.

FIG. 2 shows the envelope of the sinusoidal wave form obtained from said levels, having respectively a positive or negative sign. It is seen that two consecutive samples are generated at an interval corresponding to a phase angle of pi/4. In addition, the voltage levels have a relation with the form $$\frac{V_1}{V_2} = \frac{\sin pi/8}{\sin 3\pi/8}$$

which can be obtained with respect to two appropriate impedances connected to a reference voltage fixed to the rate of the sampling and in assigning the correct sign to each sample.

Figure 3:
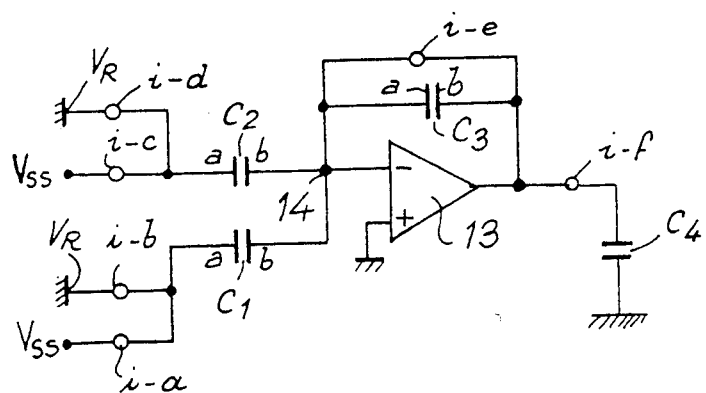
FIG. 3 is a simplified diagram of the convertor.

The principle allowing for sampling this signal in this manner is ( )* in FIG. 3. The impedences utilized are preferably capacitors easily made with CMOS technology. As will be seen hereinafter, the precision of the voltage samplings depends upon a relation of the capacitors such that the envelope of the wave form to be generated can very closely approach a sinusoid.

*(illustrated by the switched impedance converter shown)

Figure 4:
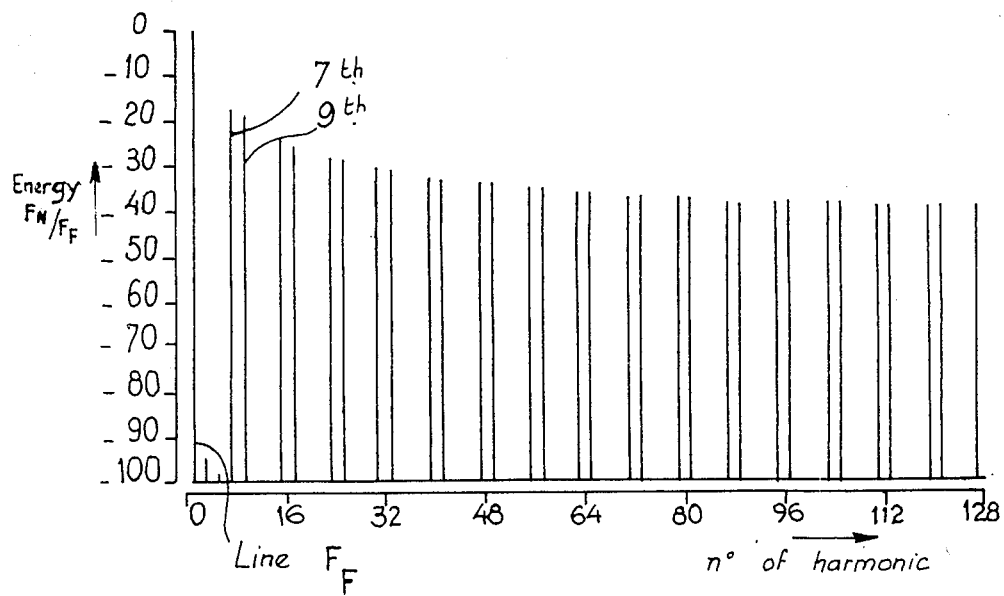
FIG. 4 shows the frequency spectrum of the wave form generated in the convertor.

It is to be noted in addition that a sinusoidal signal produced in this manner has, other than its fundamental frequency, as first important harmonics, only the seventh and ninth harmonics as well as other odd harmonics according to the frequency spectrum of FIG. 4. The diagram shows at the ordinate the relative energy between the fundamental and the harmonics and at the abscissa the numbers of the harmonics of the spectrum. It will be seen subsequently that such a spectrum can be conveniently filtered by a filter, the transfer function of which is dependent upon the fundamental frequency of the sinusoidal envelope signal, a frequency which is in fact representative of the binary signal, upon which the frequency of the sinusoid is itself dependent.

Although in the following description there will be described an embodiment of the invention having capacitors for the construction of the convertor and filter, it is to be noted that it could be constructed also with resistors appropriately connected.

FIG. 3 shows an operational amplifier 13, the non-inverting input of which is permanently connected to ground or to a potential fixed relative to another value. The inverting input is connected to junction 14 to which is connected three capacitors C1, C2, and C3. The capacitor C3 is connected between the inverting input and the output of amplifier 13. Holding capacitor C4 is connected between the output of this latter and the voltage Vss. The capacitors to C4 can be switched in or out of circuit or connected to voltages Vr and Vss by means CMOS transistor switches i-a to i-f indicated in FIG. 3 by small circles and controlled selectively by cyclic signals. The nature and the form of these signals will be set forth hereinafter with the detailed description of the convertor.

For understanding the principle of operation, the letters and b are assigned to the capacitors C1 to C3. The values of the capacitors C1 to C3 are not the same and they are selected to provide the absolute values of the voltages V1 and V2 of FIG. 2 or, in other words, the positive or negative height of the steps or samples of the desired signal.

Assuming it were desired to generate the voltage V1 (steps 1 and 4), in principle, one would remove, from holding capacitor C4, a voltage of the desired value throughout the duration of the step. In fact, in CMOS circuits, the capactive components are not capable of maintaining a charge at a constant value during a period sufficient for maintaining the step level at the same value from beginning to end ($\frac{1}{4}$ of the sine signal) because of the frequencies envisaged. For this reason, each step is generated by repeating a certain number of times (16 in the example), an elementary functioning cycle which itself has two stages. The first stage called "precharge", neutralizes the charges of the preceding elementary cycle on the capacitors which were just used, the second stage called "redistribution" creates on the holding capacitor C4, the voltage V1 or V2 with the assistance of either the capacitors C1 and C3 or capacitors C2 and C3. Each elementary signal is controlled by the proper opening of switches i-a to i-e which causes the switching of the capacitors to the differences of the distinct voltages Vr and Vss.

Thus, for example, if, during the "redistribution" phase, the capacitor C1 is connected to voltage Vss, one has:

Q1=C1Vss and Vc3=Q1/C3 from which

Vc4=C1/C3×Vss

During each redistribution phase the capacitor C4 thus receives a voltage which corresponds to a proportion of the difference in voltage between Vr and Vss, this proportion being a function of the relation between the values of the capacitors C1 and C3 on the one hand and C2 and C3 on the other.

It results from this therefore that the steps 1 to 8 of the sinusoidal envelope signal can be determined with great precision depending only on the values of the capacitor ratios which, as is well known, can be closely controlled with current CMOS technology. This constitutes one of the reasons which, thanks to the invention, makes possible the complete integration of a modem on a single integrated circuit chip.

Table 2 gives the state of the charge of the capacitors C1 to C4 for producing the steps 1 to 8 of FIG. 2, the first line of the table corresponding to the start of the function.

Figure 6:
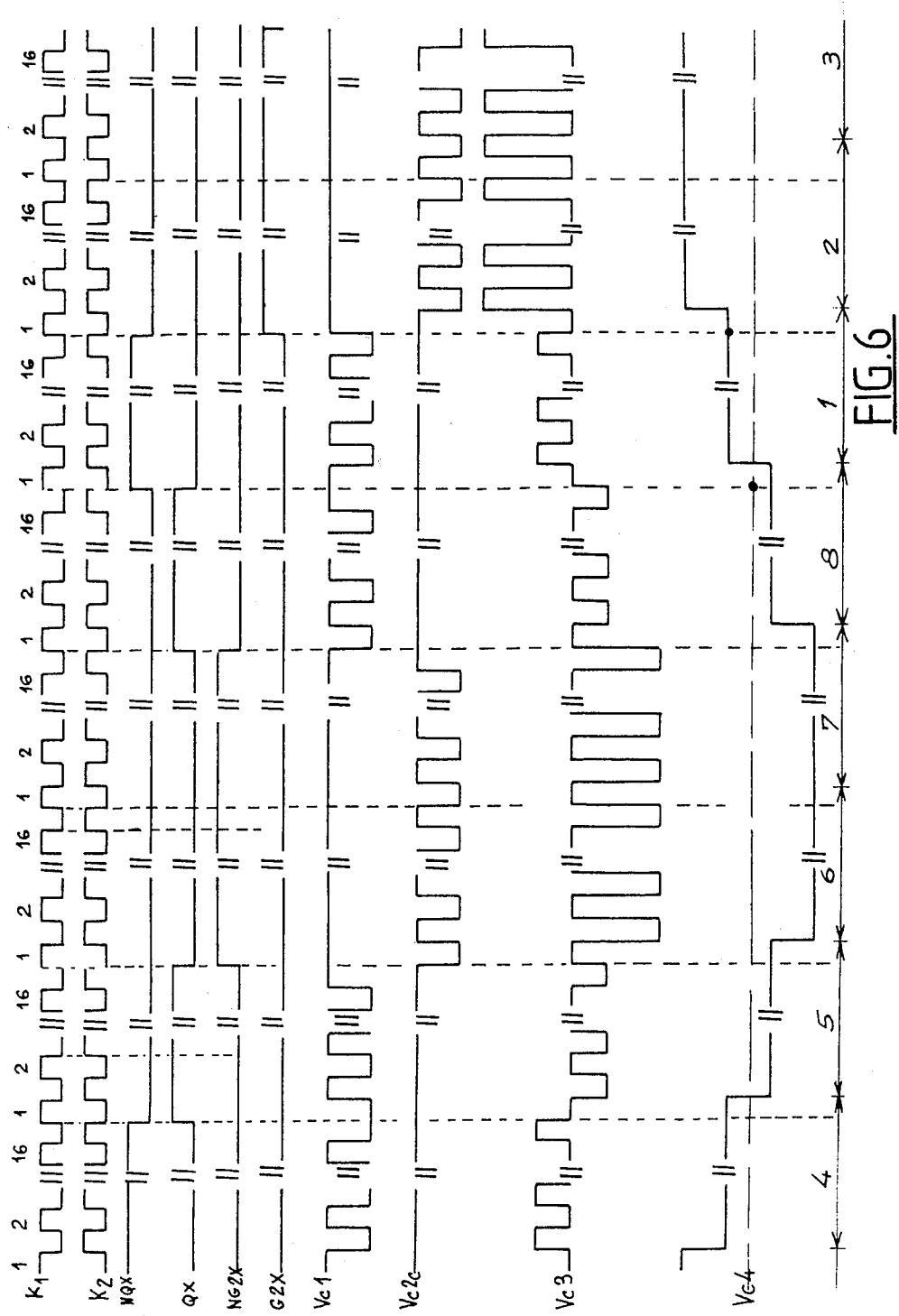
FIGS. 6 and 7 represent the signals appearing in the convertor.
Figure 7:
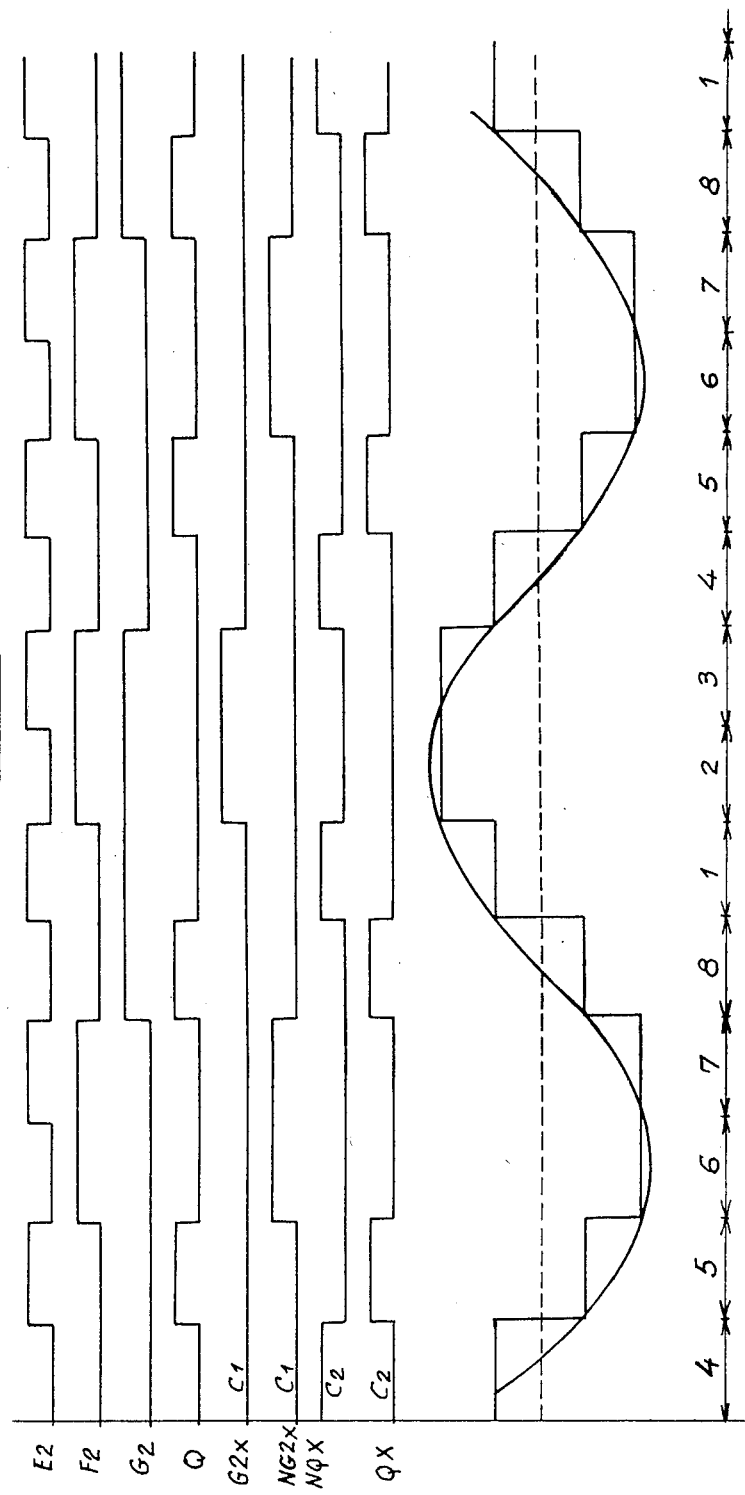

FIGS. 6 and 7 as well as the right portion of table II show the transistor control sequence, it being understood that the scales of FIGS. 6 and 7 are different.

More precisely, the capacitors C1 and C2 are each connected, by several transistors whose role is secondary and not described here, to four voltage application circuits connected by pair of lines 15 and 16 respectively. Each of these circuits include two transistors having references 17a to 24a and 17b to 24b which are selectively controlled, in regard to capacitor C1, by signals QX, NOX, K1 and K2 and, in regard to capacitor C2, by signals G2X, NG2X, K1 and K2P.

The phase ratios and the logical levels of the signals are clearly seen in FIGS. 6 and 7. The control signals are generated from the output signals of the frequency divider and applied to the corresponding transistors via delay and shaping circuits 25, 26, and 27.

As seen above, frequency divider 2 (FIG. 1), functions from a very precise base frequency and operates

TABLE II

| Level | (n°) | cycle | Stage 1 | $C_{1a}$ | $C_{1b}$ | $C_{2a}$ | $C_{2b}$ | $C_{3a}$ | $C_{3b}$ | $C_4$ | Charge | | CX | MOX | G2X | NG2X |
|---|---|---|---|---|---|---|---|---|---|---|---|---|---|---|---|---|
| 1,4 | K1 | Precharge | | O | O | O | O | O | O | X | $O-C_1V_{ss}$ | | 0 | 1 | 0 | 0 |
| | K2 | Redistribution | | $V_{ss}$ | O | O | O | O | $V_{C3}$ | $V_{C4} = V_{ss}C1/C3$ | $-V_{C3}C_3 = -C_iV_{ss}$ | | | | | |
| 2,3 | K1 | Precharge | | O | O | O | O | O | O | $V_{C4} = V_{ss}C1/C3$ | $-C_2V_{ss}$ | | 0 | 0 | 1 | 0 |
| | K2 | Redistribution | | O | O | $V_{ss}$ | O | O | $V_{C3}$ | $V_{C4} = V_{ss}C2/C3$ | $-V_3C_3 = -C_2V_{ss}$ | | | | | |
| 5,8 | K1 | Precharge | | $V_{ss}$ | O | O | O | O | O | $V_{C4} = V_{ss}C2/C3$ | $C_1V_{ss}-O$ | | 1 | 0 | 0 | 0 |
| | K2 | Redistribution | | O | O | O | O | O | $V_{C3}$ | $V_4 = -V_{ss}C1/C3$ | $-C_3V_3 = C_1V_{ss}$ | | | | | |
| 6,7 | K1 | Precharge | | O | O | $V_{ss}$ | O | O | O | $V_4 = -V_{ss}C1/C3$ | $C_2V_{ss}-O$ | | 0 | 0 | 0 | 1 |
| | K2 | Redistribution | | O | O | O | O | O | $V_3$ | $V_4 = -V_{ss}C2/C3$ | $O-C_3V_3$ | | | | | |

It has already been indicated above that the frequency of the sinusoidal envelope signal depends upon the sampling frequency which is eight times greater. It has also been seen that each step or sample is in fact constituted by a series of samples which here has been selected to be 16 times per step. It will be understood therefore that the switches which control the charge and discharge of the capacitors C1 to C4 must be activated based on a signal whose frequency is $8 \times 16 = 128$ times the fundamental frequency of the sinusoide to be produced.

It will be noted that this is a relation such that one can, with definiteness, generate a sinusoid whose frequency is determined simply by the choice of the control frequency of the switches. It results from this that one can fix and vary easily this fundamental frequency, and this very rapidly, from one cycle to another by changing the cyclic sampling signal. In addition, when a variation of the frequency of the fundamental is effected, the sinusoid has no phase discontinuity as the sample immediately following the frequency change belongs either to the same step or to the step immediately following in time, only the frequency of the obtainment of the samples being modified.

Figure 5:
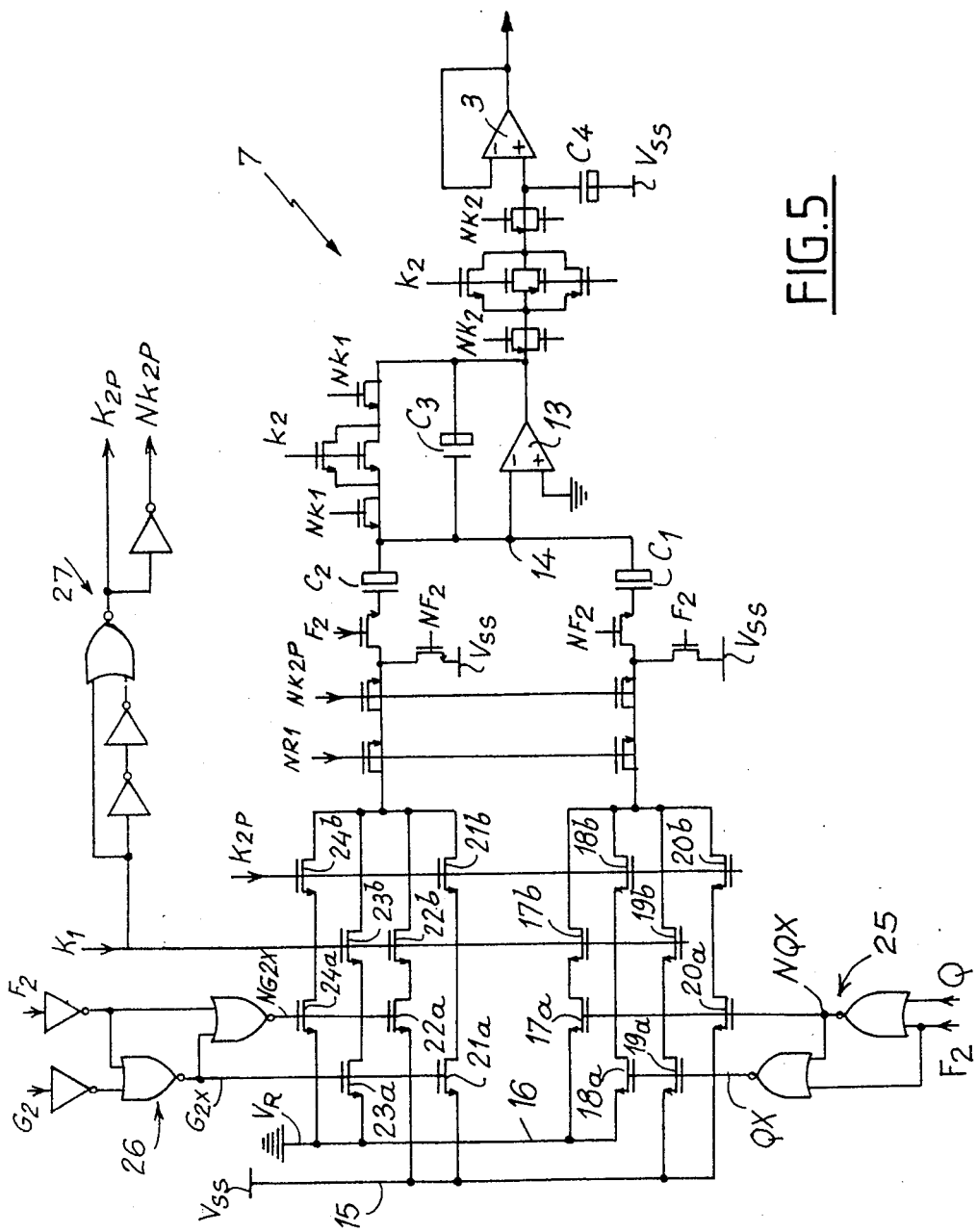
FIG. 5 is a detailed diagram of the D/A convertor.

FIGS. 5, 6 and 7 which relate to a practical convertor arrangement will now be described FIG. 5 shows four capacitors C1 to C4 and an operational amplifier 13 whose inverting input is connected to junction point 14. Voltages Vss and Vr are applied respectively to lines 15 and 16. These voltages are selectively transmitted to capacitors C1, C2, and C3 by the groups of CMOS transistors whose control electrodes receive signals derived from the signals applied to frequency divider 2.

on, for each state "1" or "0" of input 3, a group of signals whose frequencies have fixed relations among themselves. Thus, designating the base frequency as FB, one obtains:

E = 4 × FB
F = 2 × FB
G = 1 × FB
K1 and K2 = 64 × FB

Among these frequencies, F determines according to its high or low level which of the capacitors C1 and C2 is utilized, while G determines the polarity of the sine to be generated, that is, a positive polarity when G is at zero and vice-versa.

The frequency FB is determined on the one hand by the state of the input 3 and on the other hand by the standard selection signal applied to outputs 4 and 5 and a change of state on one of these inputs immediately causes a change of all of the transistor control frequencies, with the conservation of the ratios indicated above.

There will now be described the filter 10 (FIG. 8) which provides for the elimination of the upper harmonics from the frequency spectrum of the sinusoidal signal generated by generator 7, the energy content of which, in relation to that of the fundamental frequency, is seen in FIG. 4.

Figure 8:
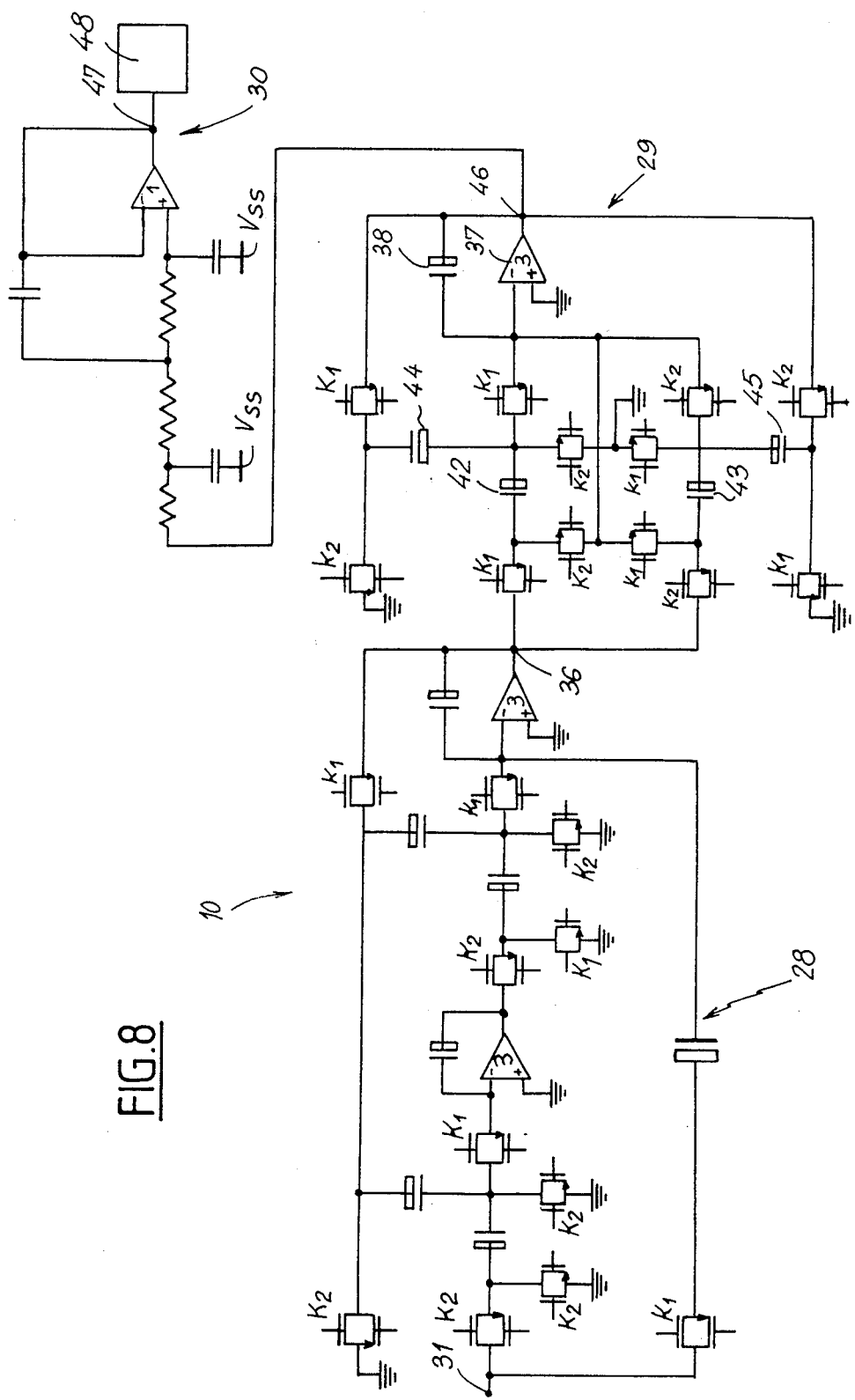
FIG. 8 is a diagram of the controlled filter connected to the convertor of FIG. 5.

FIG. 8 shows a detailed schematic of filter 10 which has three active filtering sections 28, 29 and 30 and which has a low pass attenuation curve.

The first section 28 is a second order cell, the equivalent schematic of which is seen in FIG. 9. Its input 31 is connected to the output of generator 7 D/A converter 7 (FIG. 5), and its transfer function is determined by the capacitor network which is placed in and out of circuit under control of CMOS switches, the control electrodes of which selectively receive the signals K1 and K2 from frequency divider 2. In FIG. 9, the equivalent functions of the switched capacitors are symbolized by variable resistors 32, 33, 34, and 35. It is to be noted that the signal K2 controls the precharge of the capacitors while the signal K2 determines the redistribution of the charges on the capacitors.

Figure 11:
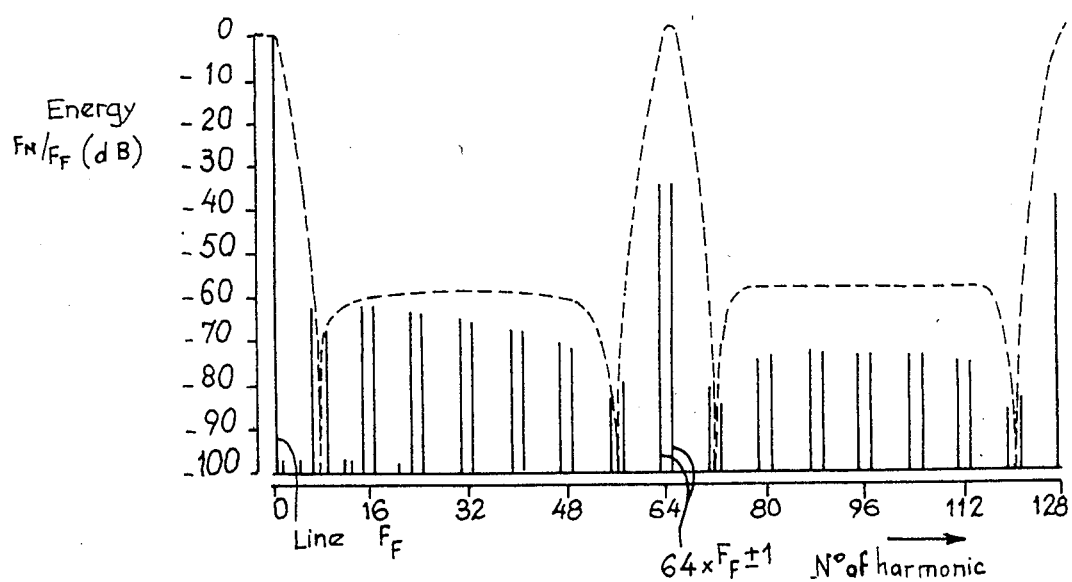

The attenuation central frequency of the filter section 28 is fixed at eight times the fundamental frequency so that it attenuates all of the harmonics of generator 2 except the harmonics which are a multiple between plus and minus 1 of the control frequency of the transistors of the section. As can be seen in FIG. 11, the spectrum of the output signal of section 28 shows several energy crests located at the fundamental frequency and at harmonics 63, 65, 127, 129 etc., all of the other harmonics being considerably surpressed.

Figure 10:
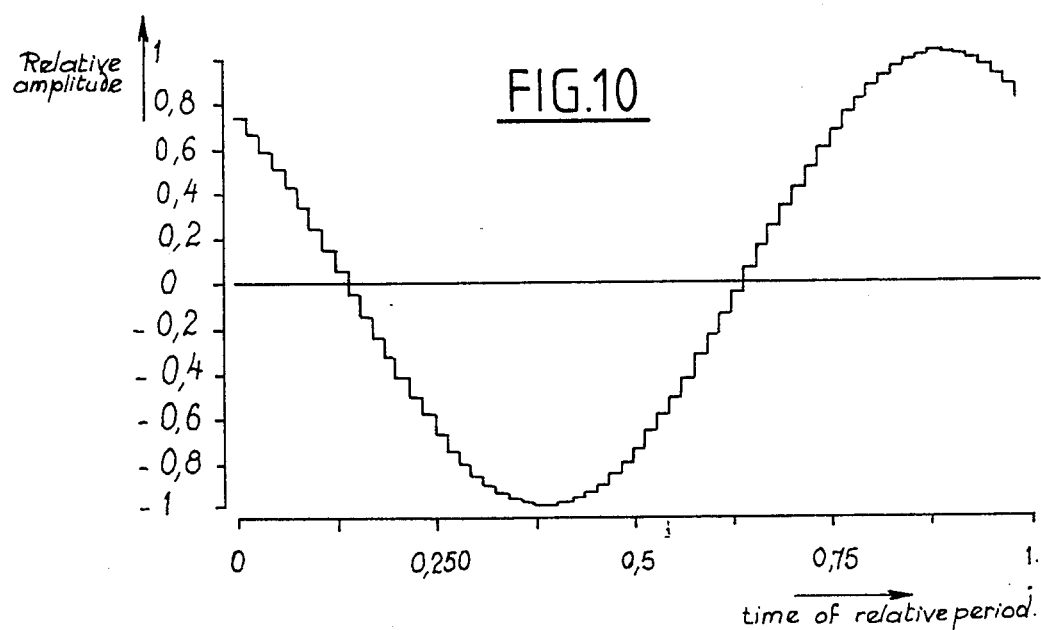
FIGS. 10 and 11 are the wave form and the spectrum, respectively, of the output signal of the first section of the filter.

FIG. 10 shows the sinusoidal signal having the form of a stair having 64 levels per period, each level corresponding to a precharge operation and an operation of redistribution of the capacitors of the filtering section.

The output signal of this section appearing on output 36 is applied to filter section 29 which is of the first order and which assures a binary transforation, the property of which is to generate a "transmission zero" at half of the sampling frequency. Its equivalent schematic is seen in FIG. 12.

This equivalent schematic shows that this section has an operational amplifier 37 associated with integrating capacitor 38 and an equivalent resistance 39. One of the inputs of the amplifier is connected to the output 36 by an equivalent resistance 40. This equivalent arrangement is in fact formed (FIG. 8) by two distinct parts of this section, of which amplifier 37 and capacitor 38 constitute known components. However, the equivalent resistance 39, 40 are formed by four capacitors in the real circuit of FIG. 8, namely, capacitors 42 and 45 which are selectively placed in circuit by the control transistors directed by the signals K1 and K2 such that at all times the parts of the section constitute, with the amplifier 37 and the capacitor 38, the filter section of the first order. As the signals K1 and K2 are out of phase by 180° and each has a frequency which is equal to 64 times the fundamental frequency Ff, the filter generates 128 samples per period of the fundamental sinusoid and this alternatively by the two parts of the section.

It is seen from the attenuation curve of FIG. 14 that there is zero transmission at 64×Ff and transmission crests at Ff and at 127 and 129K Ff. The sinusoidal signal appearing at the output 46 of section 29 has the shape of the curve of FIG. 13 in which there is seen a period of the signal including 128 steps.

There is seen in FIG. 14 that all of the harmonics up to the 126th order are attenuated at least 75 dB. The first appreciable spectral lines are therefore due to the 127 and 129 harmonics which appear in the output signal of section 29, that is, on output 46.

This output 46 is connected to the third active filter section 30 (FIG. 8) whose configurations appears as a Bessel filter. This configuration is fixed and does not depend on control signals K1 and K2. The filter section is of the third order and assures the attenuation of the remaining harmonics (128th and multiples) of the fundamental frequency so that the sinusoidal signal undergoes a simple smoothing. The output lead 47 of section 30 is connected to an emitter device 48 which feeds the telephonic transmission line.

FIG. 15 shows a diagram representing the results obtained with an embodiment according to the invention as put into practice. The verticals A and B correspond to two transmission frequencies F1 and F2 of the binary signal at the one and zero levels. It is seen that the gain and phase are practically not changed when the useful signal goes between the two logical levels.

The filter 10 which has been described thus transforms the output signal of the generator 2 to a sinusoidal signal of very low distortion while maintaining at a reduced level the group propagation time and the amplitude distortion for the two levels of the binary signal to be transmitted.

The phase coherence at the times when the binary signal to be transmitted has transitions is maximized as the passage from one frequency to another is effected immediately, that is, within the period of control signals K1 to K2, which have a frequency which is equal to 128 times the fundamental frequency, depending on whether the binary signal is 1 or 0.

The maximum positioning error (distortion isochrome) of a transition of this signal is equal to the duration of the largest segment of the output signal of generator 1. To transmit a signal at 1200 Bauds, this error is 6.54s which is an error of 0.8%.

We claim:

1. A sinusoidal signal generator comprising a clock signal generator, means for applying selection signals to the clock signal generator to produce a variable, frequency control signal; a switched impedance digital to anolog signal converter for generating from a fixed potential difference a step signal having a sinusoidal envelope, low pass filter means having an adjustable transfer function, and connected to receive the sinusoidal envelope step signal from said digital-to-analog signal converter means, and means for applying said control signals at the frequency determined by said selection signals (a) to said digital to anolog signal converter to effect impedance switching for varying the fundamental frequency of the sinusoidal envelope step signal, and (b) to the low pass filter means for adjusting the transfer function for rejecting harmonics contained in the sinusoidal envelope step signal, thereby to produce at the output of the low pass filter means a sinusoidal signal having reduced harmonic distortion.

2. A signal generator according to claim 1, wherein the digital to analog converter means and the low pass filter incorporate impedances and switch devices operable by sampling pulses to connect said impedances in a predetermined sequence to different fixed potentials.

3. A signal generator according to claim 2, wherein said sampling pulses have a repetition frequency which is multiple of the frequency of the sinusoidal signal to be generated.

4. A signal generator according to claim 3, wherein said multiple is one hundred and twenty eight, and in which each step of said step signal comprises sixteen samples.

5. A method of generating a low harmonic distortion sinusoidal signal comprising the steps of using binary selection signals to select the frequencies of clock signals; using said clock signals at a selected frequency to control switching of capacitances across fixed potential differences to generate a step signal having a sinusoidal envelope the fundamental frequency of which is dependent on the selected clock signal frequency and transmitting the step signal through a low pass filter while using said clock signals at said selected frequency to adjust the transfer function of the filter dependent on the fundamental frequency of the sinusoidal envelope for rejecting selected harmonics of the said step signal and produce at the output of the filter a sinusoidal signal having reduced harmonic distortion.

6. A method according to claim 5, wherein the switched capacitances are switched at a rate equal to one hundred and twenty eight times the frequency of the sinusoidal signal to be generated; and wherein each cycle of said sinusoidal envelope comprises eight steps.

7. A sinusoidal signal generator comprising:
clock signal generator means for generating a control signal the frequency of which can be varied; means for applying selection signals to the clock signal generator means to vary the frequency of the control signal;
reference voltage means for providing voltages from different potential levels;
digital-to-analog signal converter means coupled to said clock signal generator means and said reference voltage means for sampling said different potential levels under control of said control signals to produce a step signal having a sinusoidal envelope and a fundamental frequency which is a function of the control signal frequency and in which each step comprises a series of samples; and low pass filter means for receiving as an input the step signal from the digital to analog signal converter, and said control signals to control the transfer function of the low pass filter means as a function of said fundamental frequency of the sinusoidal envelope as determined by said control signals, for reducing harmonic distrotion in the output signal from the low pass filter means.

8. A modem including a generator according to claim 7, including means for varying the frequency of said clock signal generator means, on the one hand, by the value of a binary signal to be transmitted and, on the other hand, by said selection signals depending on a transmission standard for the binary signal.

9. A sinusoidal signal generator according to claim 7, wherein the reference voltage means is for providing two voltages of one polarity and two voltages of the opposite polarity, the relation R between two voltages of the same polarity being:

$$R = \frac{\sin \pi/8}{\sin 3\pi/8}$$

10. A sinusoidal signal generator according to claim 9, wherein the reference voltage means comprises a plurality of capacitances and switch means for receiving signals from the clock signal generator means to connect the capacitances in different configurations with fixed potentials for providing said different voltage levels.

11. A sinusoidal signal generator according to claim 10, wherein the switch means comprise field effect transistors having gates for receiving said signals from the clock signal generator means.

12. A sinusoidal signal generator according to claim 7, wherein the digital-to-analog signal converter means includes CMOS transistors for effecting said sampling by connecting capacitances in different configurations such that the step levels of said step signal are determined by capacitance ratios.

13. A sinusoidal signal generator according to claim 7, wherein the low pass filter means includes first and second filter sections having different filter characteristics for filtering selected harmonics of said sinusoidal envelope step signal as a function of the fundamental frequency of the sinusoidal envelope of the step signal as determined by said control signals.

14. A sinusoidal signal generator according to claim 13, wherein each filter section includes a plurality of capacitances connected to switch means for receiving signals from said clock signal generator means to sample said capacitances at a sampling rate which is a function of the sampling frequency for said digital to analog converter.

15. A sinusoidal signal generator according to claim 14, wherein the said filter capacitance switch means comprise field effect transistors having gates for receiving said sampling signals.

16. A sinusoidal signal generator according to claim 14, wherein the sampling rate for the capacitances of the second filter section is a multiple of the fundamental frequency of the sinusoidal envelope of the step signal.

17. A sinusoidal signal generator according to claim 16, wherein the sampling rate for the capacitances of the second filter section is twice that for the capacitances of the first filter section.

18. A sinusoidal signal generator according to claim 17, wherein the sampling rate for the capacitances of the first and second filter sections are, respectively, 64 and 128 times the fundamental frequency of the sinusoidal envelope of the step signal.

19. A sinusoidal signal generator according to claim 13, wherein the low-pass filter means includes a Bessel type third filter section for smoothing the signal output from the second filter section.

20. A sinusoidal signal generator according to claim 13, wherein said multiple is sixty four.

21. A sinusoidal signal generator according to claim 20, wherein the first filter section characteristics include rejection of the seventh and ninth harmonics of the fundamental frequency of the sinusoidal envelope of the step signal.

22. A sinusoidal signal generator according to claim 21, wherein the second filter section characteristics include rejection of the 64th harmonic of the fundamental frequency of the sinusoidal envelope of the step signal.

23. A modem including a sinusoidal signal generator having a clock signal generator for generating control signals the frequency of which can be varied; reference voltage means for providing voltages from different potential levels; digital-to-analog signal converter means coupled to said clock signal generator means and said reference voltage means for sampling said different potential levels under control of said control signals at a selected frequency to produce a step signal having a sinusoidal envelope and fundamental frequency which is a function of the control signal frequency; and low pass filter means for receiving as an input the step signal from the digital to analog signal converter, and said control signals at said selected frequency to control the transfer function of the low pass filter means as a function of said fundamental frequency of the sinusoidal envelope as determined by said control signals at said selected frequency value, for reducing harmonic distortion in the output signal from the low pass filter means and means for applying selection signals to the clock signal generator means to vary the frequency of the control signal to selected values in accordance with (a) the binary value of a signal to be transmitted by the modem and (b) a transmission standard for said signal to be transmitted.

24. A modem according to claim 23, wherein the means for applying selection signals applies signals for FSK modulation according to a selected one of a plurality of standards.

* * * * *